United States Patent
Minemoto et al.

(10) Patent No.: US 8,916,124 B2
(45) Date of Patent: Dec. 23, 2014

(54) GROUP III NITRIDE CRYSTAL, METHOD FOR GROWING THE GROUP III NITRIDE CRYSTAL, AND APPARATUS FOR GROWING THE SAME

(75) Inventors: Hisashi Minemoto, Osaka (JP); Osamu Yamada, Ehime (JP); Takeshi Hatakeyama, Ehime (JP); Hiroaki Hoshikawa, Ehime (JP); Yasunori Tokunou, Ehime (JP)

(73) Assignee: Ricoh Company, Ltd., Tokyo (JP)

( * ) Notice: Subject to any disclaimer, the term of this patent is extended or adjusted under 35 U.S.C. 154(b) by 751 days.

(21) Appl. No.: 12/745,809

(22) PCT Filed: Nov. 27, 2008

(86) PCT No.: PCT/JP2008/003483
§ 371 (c)(1),
(2), (4) Date: Jun. 2, 2010

(87) PCT Pub. No.: WO2009/072254
PCT Pub. Date: Jun. 11, 2009

(65) Prior Publication Data
US 2010/0260656 A1    Oct. 14, 2010

(30) Foreign Application Priority Data

Dec. 5, 2007 (JP) ................. 2007-314096

(51) Int. Cl.
*C01B 21/06* (2006.01)
(Continued)

(52) U.S. Cl.
CPC ............... *C30B 29/403* (2013.01); *C30B 19/06* (2013.01); *C30B 19/02* (2013.01); *C30B 17/00* (2013.01); *C30B 19/063* (2013.01); *C30B 29/406* (2013.01); *C30B 9/10* (2013.01)
USPC ................. 423/409; 117/19; 117/64; 117/71; 117/73; 117/82; 117/81; 117/83; 117/95; 117/96; 117/937; 117/952; 423/406

(58) Field of Classification Search
None
See application file for complete search history.

(56) References Cited

U.S. PATENT DOCUMENTS

| | | | |
|---|---|---|---|
| 7,255,742 B2 * | 8/2007 | Kitaoka et al. | 117/81 |
| 7,452,814 B2 * | 11/2008 | Matsumoto | 438/689 |
| 8,623,138 B2 * | 1/2014 | Sarayama et al. | 117/200 |
| 2007/0215035 A1 | 9/2007 | Kitaoka et al. | |
| 2009/0000538 A1 * | 1/2009 | Iwai et al. | 117/19 |

FOREIGN PATENT DOCUMENTS

| | | |
|---|---|---|
| JP | 2000-327495 | 11/2000 |
| JP | 2001-053013 | 2/2001 |

(Continued)

OTHER PUBLICATIONS

Definition axis; Merriam Webster; www.merriam-webster.com/dictionary/axis; Sep. 25, 2013.*

*Primary Examiner* — Guinever Gregorio
(74) *Attorney, Agent, or Firm* — Cooper & Dunham LLP

(57) ABSTRACT

When a group III nitride crystal is grown in a pressurized atmosphere of a nitrogen-containing gas from a melt 50 including at least a group III element, nitrogen and an alkali metal or an alkali earth metal, a melt-holding vessel 160 that holds the above-described melt 50 is swung about two axes different in direction from each other such as an X-axis and a Y-axis.

15 Claims, 13 Drawing Sheets

(51) Int. Cl.
*C30B 29/38* (2006.01)
*C30B 15/00* (2006.01)
*C30B 19/00* (2006.01)
*C30B 7/00* (2006.01)
*C30B 9/00* (2006.01)
*C30B 11/00* (2006.01)
*C30B 17/00* (2006.01)
*C30B 21/02* (2006.01)
*C30B 23/00* (2006.01)
*C30B 25/00* (2006.01)
*C30B 29/10* (2006.01)
*C30B 29/40* (2006.01)
*C30B 19/06* (2006.01)
*C30B 9/10* (2006.01)
*C30B 19/02* (2006.01)

(56) References Cited

FOREIGN PATENT DOCUMENTS

| | | |
|---|---|---|
| JP | 2002-068896 | 3/2002 |
| JP | 2002-293696 | 10/2002 |
| JP | 2005-187317 | 7/2005 |
| JP | 2005-247615 | 9/2005 |
| JP | 2005-263622 | 9/2005 |
| JP | 2006-240959 | 9/2006 |
| WO | WO 2007102610 A1 * | 9/2007 |

* cited by examiner

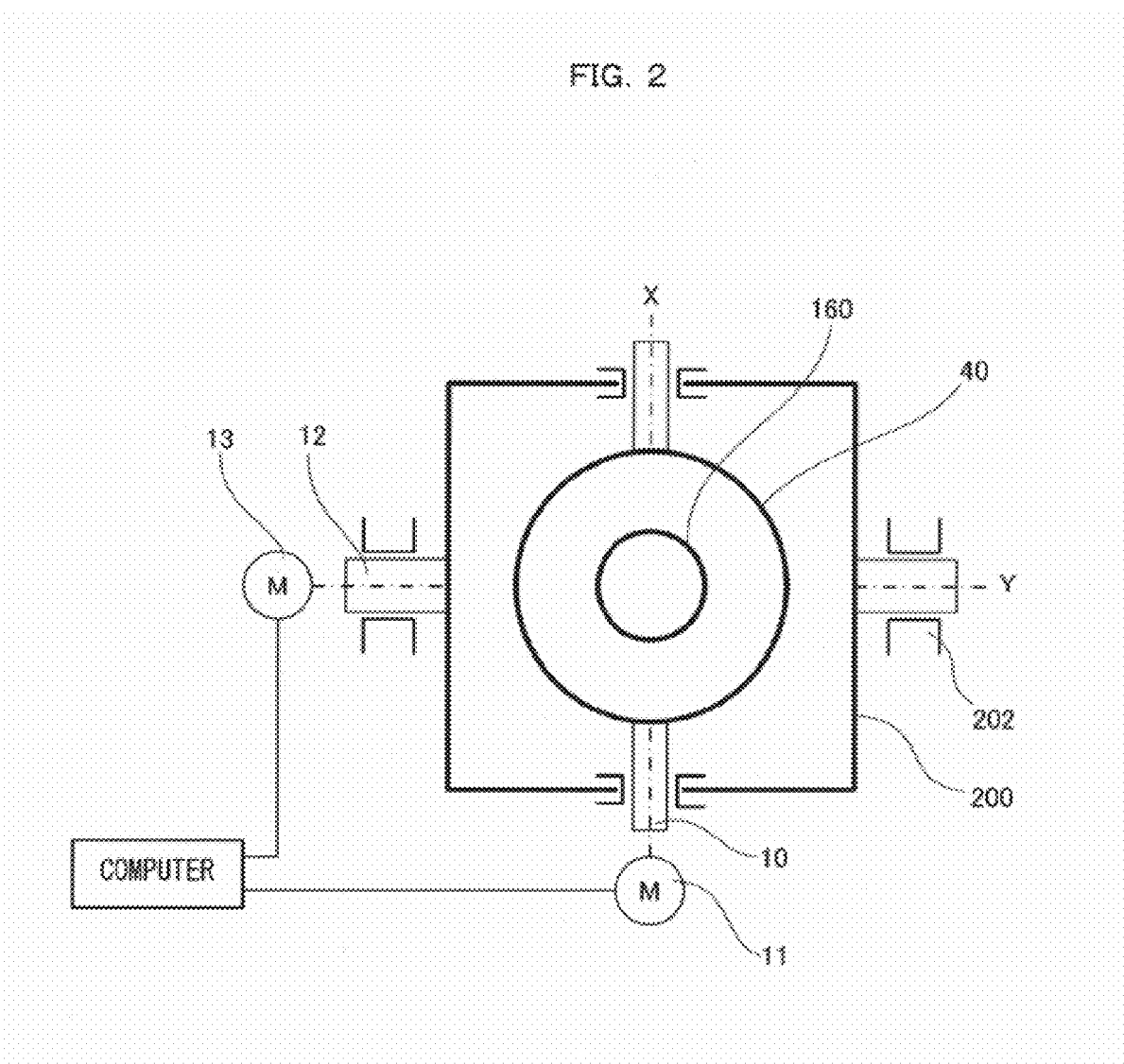

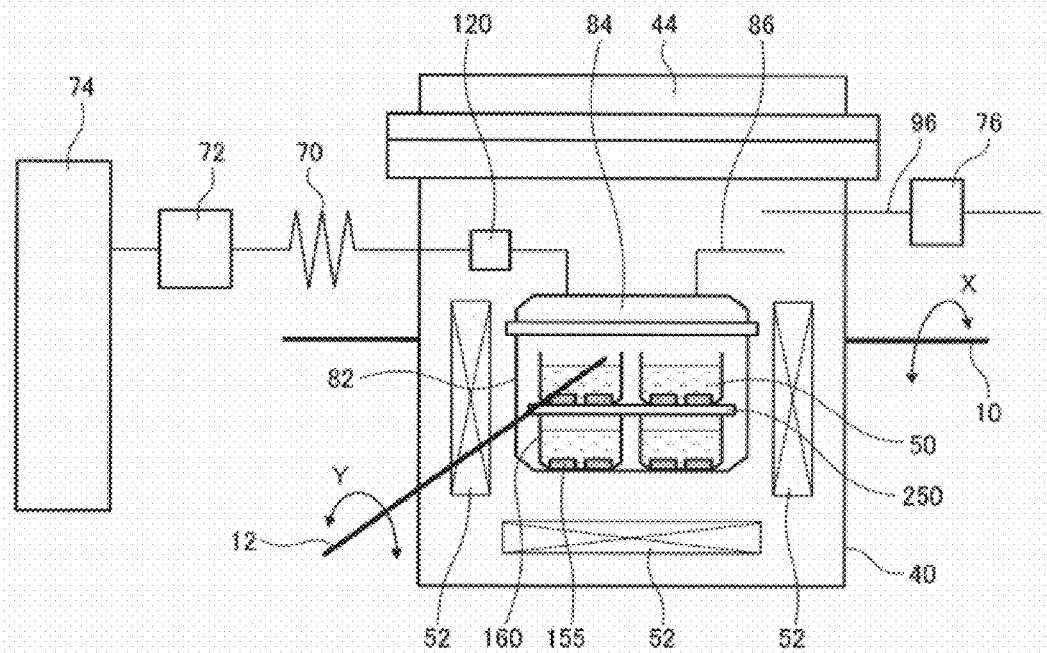

PRESENT INVENTION

GROUP III NITRIDE CRYSTAL, METHOD FOR GROWING THE GROUP III NITRIDE CRYSTAL, AND APPARATUS FOR GROWING THE SAME

TECHNICAL FIELD

The present invention relates to a group III nitride crystal, a method for growing the group III nitride crystal, and an apparatus for growing the same, more specifically, a technique for stirring a starting material melt of the group III nitride crystal.

BACKGROUND ART

Group III nitride semiconductors such as a gallium nitride (GaN) semiconductor (hereinafter referred to as group III nitride compound semiconductors or GaN type semiconductors, as the case may be) are attracting attention as the materials for blue light or ultraviolet light-emitting semiconductor elements. Blue laser diodes (LDs) are applied to high-density optical discs or high-density displays, and blue light-emitting diodes (LEDs) are applied to displays or illumination. Ultraviolet LDs are expected to be applied to biotechnology and the like, and ultraviolet LEDs are expected to be applied as ultraviolet light sources for fluorescent lamps.

Substrates composed of the group III nitride semiconductors (such as GaN) for use in LDs and LEDs are usually formed on sapphire substrates by heteroepitaxially growing group III nitride single crystals with vapor phase epitaxial growth methods. Examples of the vapor phase growth methods include the metal organic chemical vapor deposition method (MOCVD method), the hydride vapor phase epitaxy method (HVPE method) and the molecular beam epitaxy method (MBE method).

Instead of vapor phase epitaxial growth, methods for growing crystals in liquid phase have also been investigated. The nitrogen equilibrium vapor pressure at the melting point of the single crystal of group III nitride such as GaN or JUN is ten thousands atm or more. Accordingly, it has been accepted that the growth of GaN in the liquid phase requires the conditions set at 1200° C. (1473 K) and 8000 atm ($8000 \times 1.01325 \times 10^5$ Pa). In contrast, recently it has been shown that the use of an alkali metal such as Na as a flux enables the synthesis of GaN at a relatively low temperature of 750° C. (1023 K) and a relatively low pressure of 50 atm ($50 \times 1.01325 \times 10^5$ Pa).

Recently, in an ammonia-containing nitrogen gas atmosphere, a mixture composed of Ga and Na is melted at 800° C. (1073 K) and 50 atm ($50 \times 1.01325 \times 10^5$ Pa), and single crystals having a maximum crystal size of about 1.2 mm have been obtained by using the resulting melt, with a growth time of 96 hours (for example, see Patent Document 1).

There has also been reported a method in which a GaN crystal layer is formed as a film on a sapphire substrate by the metal organic chemical vapor deposition (MOCVD) method, and then a single crystal is grown by the liquid phase epitaxy (LPE) method (for example, see Patent Document 2).

Additionally, as the melt stirring method applied in the growth of the group III nitride crystal, various methods have been proposed, and for example, the following methods have been disclosed:

(a) A method in which a crystal is rotated (Patent Document 3)

(b) A method in which a melt-holding vessel is rotated or swung (Patent Documents 4 and 5)

(c) A method in which a melt is stirred by taking advantage of the temperature difference (Patent Document 6)

Patent Document 1: JP2002-293696A
Patent Document 2: JP2000-327495A
Patent Document 3: JP2002-68896A
Patent Document 4: JP2001-53013A
Patent Document 5: JP2005-247615A
Patent Document 6: JP2006-240959A

DISCLOSURE OF THE INVENTION

Problems to be Solved by the Invention

However, among the liquid phase epitaxy methods of group III nitride crystals, using an alkali metal or an alkali earth metal as a flux, the above-described methods (a) and (b) suffer from the occurrence of problems due to difficulties in rotation of a crystal or a melt-holding vessel in a pressure vessel. In other words, although these: methods require the insertion of a rotary shaft into the pressure vessel under the condition free from leakage from outside the pressure vessel, actually the leakage of impurity gases such as oxygen or moisture tends to occur to make it difficult to perform crystal growth without involving the deterioration of the alkali metal or the alkali earth metal extremely sensitive to these leaked gases. Consequently, macro-defects are generated in the interior of the grown crystal or the growth rate is extremely decreased.

Additionally, in the method (c) that solely uses the temperature difference, difficulty in uniformly stirring the melt in the melt-holding vessel may occur, and accordingly the unevenness of the crystal thickness is likely to occur or the macro-defects (in particular, inclusions) are likely to be generated in the interior of the crystal, to make it difficult to obtain a large uniform crystal.

In view of the above-described problems, an object of the present invention is to grow a group III nitride crystal that has few macro-defects and is uniform.

Means for Solving the Problems

For the purpose of solving the above-described problems, the method for growing a group III nitride crystal of the present invention is a method wherein when a group III nitride crystal is grown in a pressurized atmosphere of a nitrogen-containing gas from a melt including at least a group III element, nitrogen and an alkali metal or an alkali earth metal, a melt-holding vessel that holds the above-described melt is swung about two axes different in direction from each other.

Additionally, the apparatus for growing a group III nitride crystal of the present invention is an apparatus which includes a pressure vessel, a melt-holding vessel disposed in the pressure vessel, a gas feeder and a gas pipe for feeding a nitrogen-containing gas into the melt-holding vessel, and a heater for heating the melt-holding vessel, the apparatus growing a group III nitride crystal by forming a nitrogen-containing melt in a pressurized atmosphere of the nitrogen-containing gas in the melt-holding vessel disposed in the pressure vessel with at least a group III element and an alkali metal or an alkali earth metal placed in the melt-holding vessel, wherein the apparatus comprises a swing unit for swinging the melt-holding vessel about two axes different in direction from each other.

In this connection, for the purpose of reducing macro-defects in a group III nitride crystal and obtaining a uniform crystal, it is important to sufficiently perform the stirring of the melt in the melt-holding vessel, in particular, to perform the stirring in such a way that the melt is made to flow with a sufficient flow velocity over the whole of the vessel bottom or the whole of the interface between the melt and the seed crystal. By swinging the melt-holding vessel about two axes as described above, the melt in the melt-holding vessel can be made to flow with a sufficient flow velocity over the whole of the vessel bottom (or the whole of the interface between the melt and the seed crystal). Further, for the first time, the present inventors discovered that by swinging about two axes, it is made possible to form a uniform flow of the melt over the whole melt-holding vessel, the conventional swinging about one axis having difficulty in forming such a uniform flow of the melt. Consequently, it is made possible to grow a group III nitride crystal having few macro-defects and being excellent in the uniformity of the film thickness distribution.

The melt-holding vessel can be swung through the intermediary of the pressure vessel in which the melt-holding vessel is disposed. Consequently, it is made possible to eliminate the insertion of a shaft for stirring the melt into the pressure vessel and to eliminate slight leakage of impurity gases caused by such an insertion.

The nitrogen-containing gas can be fed from the gas feeder disposed in the vicinity of the pressure vessel or from the gas feeder through an impurity remover disposed in the vicinity of the pressure vessel. In the former case, the use of a flexible gas pipe can be eliminated or even when a flexible gas pipe is used, the gas adsorption area can be made small. In the latter case, even when a flexible gas pipe is used, the nitrogen-containing gas can be highly purified before reaching the pressure vessel, and hence a high purity gas can be fed to the pressure vessel.

The impurity gases as referred to herein mean gases adversely affecting the growth of the group III nitride crystals with the nitrogen-containing gas (such as nitrogen gas or ammonia gas), examples of the adversely affecting gases including oxygen, moisture, and gases of oil components used in valves and the like. Hydrogen and various rare gases intentionally mixed as carrier gases or the like are not included in the impurity gases. Examples of the group III nitride crystal include GaN, AlN, AlGaN, InGaN and InN.

Advantages of the Invention

The growth apparatus and the growth method of the present invention are designed to swing the melt-holding vessel about two axes, and hence the melt in the melt-holding vessel can be made to flow over the whole of the interface between the melt and the vessel bottom (or the seed crystal) with a sufficient flow velocity, and it is also made possible to form a uniform flow of the melt over the whole melt-holding vessel. The swing frequency and the phase relation about each of the axes can be optionally specified, and hence optimal values can be searched for while examining the crystal growth results. Consequently, it is made possible to grow a crystal having few macro-defects, having a small crystal thickness non-uniformity and being excellent in the in-plane uniformity.

By swinging the melt-holding vessel through the intermediary of the pressure vessel in which the melt-holding vessel is disposed, it is made possible to eliminate the insertion of a shaft for stirring the melt into the pressure vessel and to eliminate the slight leakage of the impurity gases caused by such an insertion. Consequently, it is made possible to suppress the generation of macro-defects in the interior of the crystals and the decrease of the growth rate, due to the impurity gases.

Additionally, by feeding the nitrogen-containing gas from the gas feeder disposed in the vicinity of the pressure vessel, or from the gas feeder through the impurity remover disposed in the vicinity of the pressure vessel, it is made possible to prevent the deterioration of the gas purity in the midstream positions in the pipe and to further reduce the macro-defects such as inclusions in the crystal.

BRIEF DESCRIPTION OF THE DRAWINGS

FIG. 2 is a schematic sectional view illustrating, from above, the configuration of the apparatus for growing a crystal of FIG. 1;

FIG. 14 is a schematic sectional view illustrating the configuration of an apparatus for growing a crystal of a seventh embodiment of the present invention;

BEST MODE FOR CARRYING OUT THE INVENTION

Hereinafter, embodiments of the present invention are described with reference to the accompanying drawings.

First Embodiment

Figure 1:
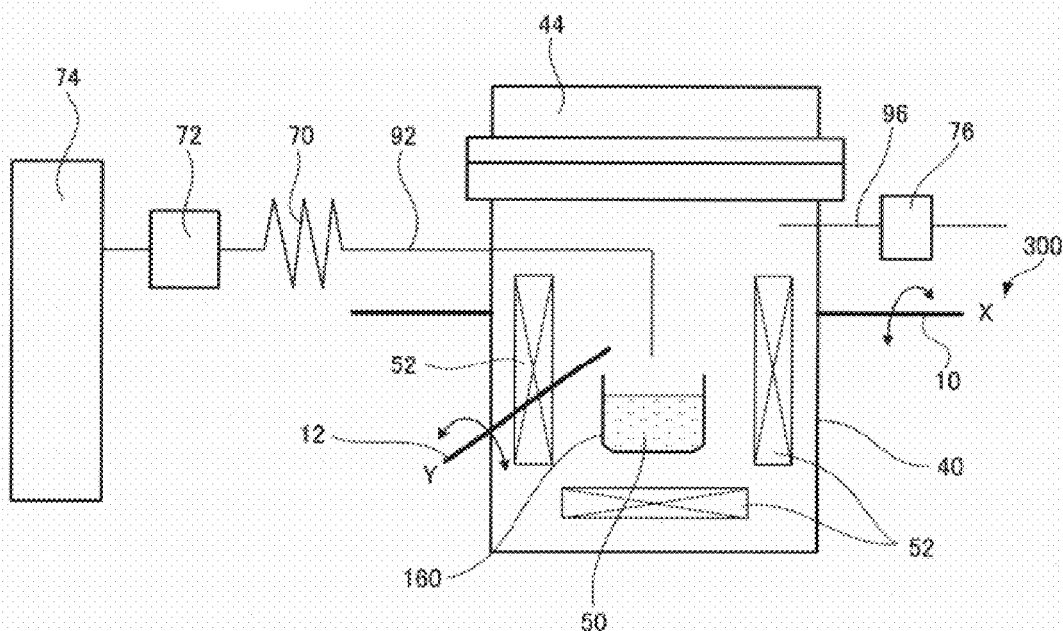
FIG. 1 is a schematic sectional view laterally illustrating the configuration of an apparatus for growing a crystal of a first embodiment of the present invention.

FIGS. 1 and 2 illustrate the configuration of an apparatus for growing a crystal of the first embodiment of the present invention.

The apparatus for growing a crystal includes a pressure vessel 40, a melt-holding vessel 160 disposed in the pressure vessel 40, a heating unit 52 for heating the melt-holding vessel 160, a gas feeder 74 and a gas pipe 92 for feeding a nitrogen-containing gas into the melt-holding vessel 160 and a swing unit 300 for swinging the melt-holding vessel 160 about two axes different in direction from each other. Although not shown, the apparatus for growing a crystal also includes a vacuum evacuation system for evacuating the pressure vessel 40.

The two axes are horizontal (or nearly horizontal) axes, and the angle between the two axes is 90° (or approximately 90°, and hence the two axes are represented by the X-axis and the Y-axis. Here, the statement that the two axes are nearly horizontal is defined to mean that the two axes are each tilted from a horizontal axis within a range of ±20°. Even when an axis is tilted by ±20° from a horizontal axis, the same result as the result obtained with the horizontal axis can be obtained. Additionally, the statement that the angle between the X-axis and the Y-axis is approximately 90° is defined to mean that the angle between the X-axis and the Y-axis falls within a range of 90°±20°. Even when the swinging is performed with an angle different from 90° by ±20°, the same effect as the effect obtained with 90° can be obtained. The swing unit 300 swings the melt-holding vessel 160 through the intermediary of the pressure vessel 40, and includes a first swing shaft 10 in the X-axis direction for swinging the pressure vessel 40 and a second swing shaft 12 in the Y-axis direction for swinging the pressure vessel 40.

The pressure vessel 40 is a stainless steel high pressure vessel having a lid 44, and the melt-holding vessel 160 is a vessel made of a material hardly reactive with an alkali metal and a group III element such as alumina, yttria or tantalum. The heating unit 52 is a resistance heating or RF heating heater formed of a Ni—Cr resistance wire or a carbon heater. A heat insulating material (not shown) can use either a common alumina heat insulating material or a carbon heat insulating-material. Because of a smaller adsorption of impurity gases, it is preferable to use the carbon heat insulating material.

The gas feeder 74 is for high pressure, and the gas pipe 92 is disposed from the gas feeder 74 to the interior of the pressure: vessel 40, and the end of the gas pipe 92 is located above the melt-holding vessel 160. In the gas pipe 92 between the gas feeder 74 and the pressure vessel 40, a gas flow regulator 72 is disposed in an intervening manner, a part of the gas pipe 92 is a flexible gas pipe 70. The pressure vessel 40 is also equipped with a gas discharge pipe 96, in which a pressure regulator 76 is disposed in an intervening manner, so as to discharge a gas to the outside, where needed, through a harm remover (not shown).

The first swing shaft 10 (hereinafter referred to as the X-axis swing shaft 10) extends from the periphery of the pressure vessel 40 and is supported by a support 200 in a freely swingable manner, and the second swing shaft 12 (hereinafter referred to as the Y-axis swing shaft 12) extends from the periphery of the support 200 and is supported by a support 202 in a freely swingable manner. Reference numerals 11 and 13 denote the driving systems of the X-axis swing shaft 10 and the Y-axis swing shaft 12, respectively. As these driving systems 11 and 13, driving sources such as direct driving motors may be incorporated into the X-axis swing shaft 10 and the Y-axis swing shaft 12, or alternatively, the X-axis swing shaft 10 and the Y-axis swing shaft 12 may be indirectly driven by incorporating various gears and cams between each of the X-axis swing shaft 10 and the Y-axis swing shaft 12 and the driving source.

In the apparatus for growing a crystal having the above-described configuration, a group III nitride crystal is grown from a melt 50 including at least a group III element, nitrogen and an alkali metal or an alkali earth metal in a pressurized atmosphere of a nitrogen-containing gas.

For that purpose, the melt-holding vessel 160 in which at least a group III element and an alkali metal or an alkali earth metal are placed is disposed, in a nitrogen-containing gas atmosphere, in the pressure vessel 40, and the melt-holding vessel 160 is heated with the heating unit 52 in a pressurized atmosphere of the nitrogen-containing gas fed from the gas feeder 74. Here, Ga, Na and a nitrogen gas are assumed to be used.

In this way, in the melt-holding vessel 160, the melt 50 including Ga, Na and nitrogen is formed, and a group III nitride crystal is grown from the melt 50 at an intended temperature and an intended growth pressure, for example, under the conditions of 800 to 950° C. and 2 to 10 MPa. The unreacted gas that has not contributed to the reaction in the melt-holding vessel 160 is discharged through the pressure regulator 76 and the gas discharge pipe 96.

In this case, the melt-holding vessel 160 that holds the melt 50 is swung about the two axes (X-axis and Y-axis). In other words, the X-axis swing shaft 10 and the Y-axis swing shaft 12 swing the pressure vessel 40, thereby swinging the melt-holding vessel 160, and thus the melt 50 in the melt-holding vessel 160 is stirred. In this way, the collision of the melt 50 with the vessel wall is eliminated or alleviated, and hence the generation of non-uniform nuclei due to the collision can be avoided. The formation of the uniform flow of the melt all over the whole melt-holding vessel is also made possible.

A too small frequency of the swing motion results in insufficient stirring of the melt, and a too large frequency of the swing motion offers a cause for the generation of non-uniform nuclei. Thus, appropriate setting of the frequencies of the swing motions about the X-axis and the Y-axis permits realizing motions having various trajectories (such as Lissajous figures), and permits an appropriate degree of melt stirring. The optimal ranges of the frequencies and others are obtained only by setting a program for the driving sources for driving the X-axis swing shaft 10 and the Y-axis swing shaft 12 and a program for a controller to control these driving sources, and the program setting can be easily altered. A part of the gas pipe 92 is the flexible gas pipe 70, so as not to disturb the swinging. Although the apparatus structure involved is comparatively simple, the collision of the melt 50 with the wall of the melt-holding vessel 160 is suppressed and the entire melt 50 in the melt-holding vessel 160 can be stirred satisfactorily uniformly.

Because the adopted system is different from a system in which a shaft is inserted from outside the pressure vessel 40 as in a conventional system such as a system for rotating the melt-holding vessel 160 (crucible) or a system for rotating the crystal, it is possible to eliminate the deterioration of the alkali metal or the alkali earth metal due to oxygen and moisture contained in the air reversely diffusing into the pressure vessel 40 from the shaft portions.

Even when impurity gases are generated from the pressure vessel 40, the heating unit 52 such as a heater disposed in the pressure vessel 40, the heat insulating material (not shown) or the like, the impurity gases are discharged through the gas discharge pipe 96, and hence the reaction of the impurity gases with the melt 50 in the melt-holding vessel 160 can be prevented as much as possible. It is to be noted that the gas pipe 92, in particular, the flexible gas pipe 70 is preferably as short as possible and is preferably as small as possible in adsorption area. The flexible gas pipe 70 is further described later.

The simulation results of the flow of the melt under the swing operation are shown in FIGS. 3A, 3B, 4A, 4B, 5A, 5B, 6A and 6B.

Figure 3A:
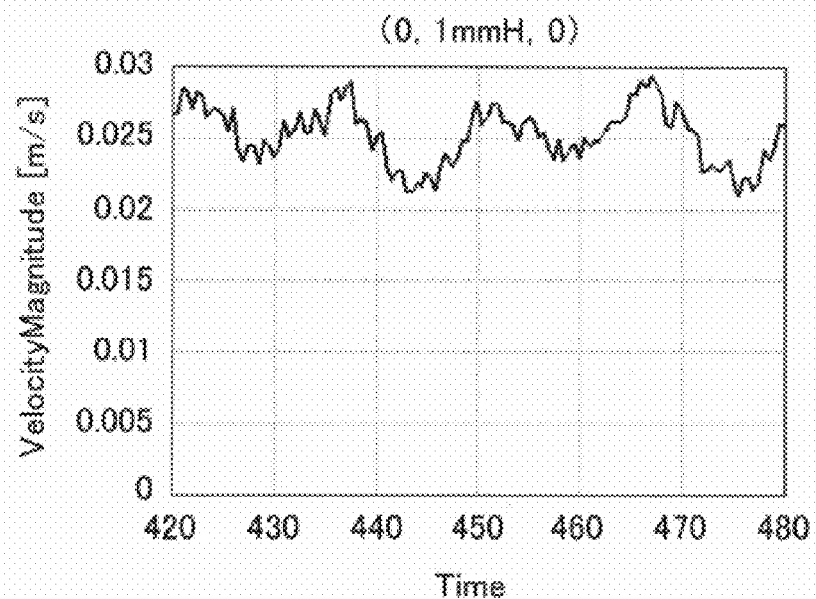
FIG. 3A is a graph showing the calculated results of the flow velocity of a melt under biaxial swinging.

FIG. 3A shows the time variation of the flow velocity of the melt in the vicinity of the bottom of the melt-holding vessel (in the vicinity of the crystal growth surface) in the case of a biaxial (X-axis and Y-axis) swing operation; FIG. 3A shows the flow velocity at a position separated from the vessel bottom by a distance of Z=1 mm where the swing frequencies are fx=fy=0.017 (Hz) and the swing amplitudes are a=b=±4°.

Figure 3B:
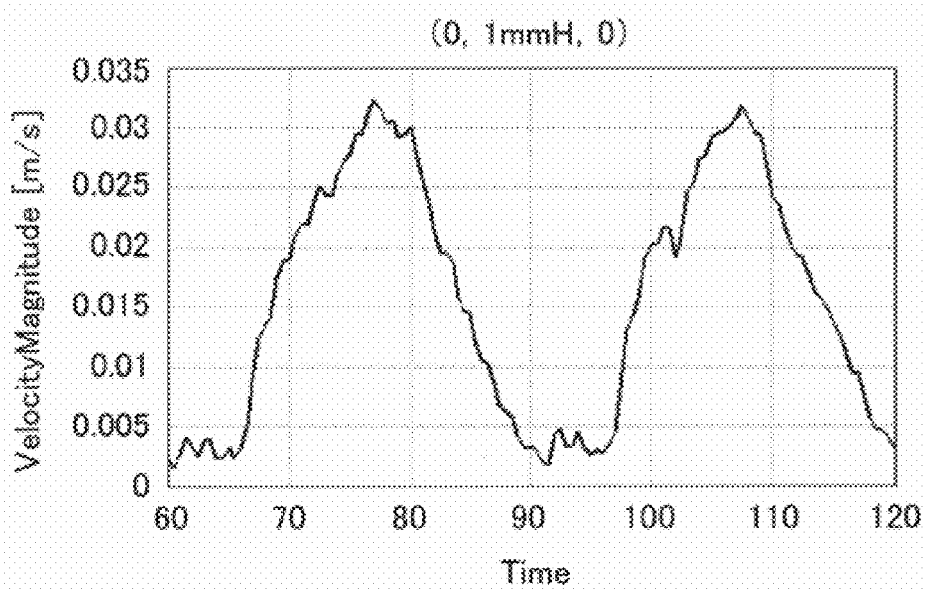
FIG. 3B is a graph showing the calculated results of the flow velocity of a melt under uniaxial swinging.

FIG. 3B shows, for comparison, the time variation of the flow velocity of the melt in the vicinity of the bottom of the melt-holding vessel (in the vicinity of the crystal growth surface) in the case of a uniaxial (X-axis) swing operation. Except for the uniaxial swing operation, the conditions are the same as in FIG. 3A.

Figure 4A:
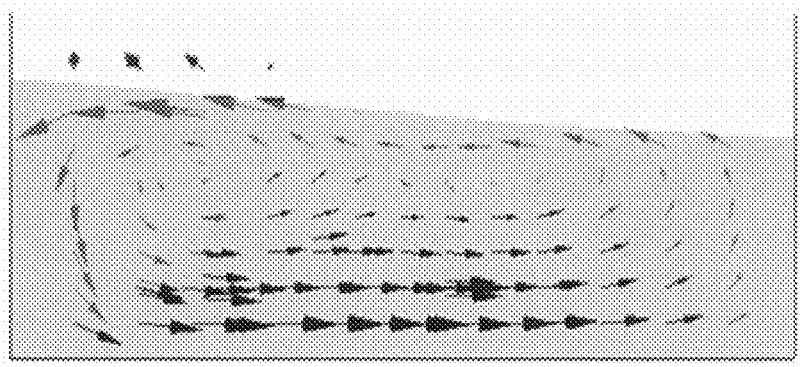
FIG. 4A is a diagram showing the calculated results of the magnitude and the direction of the flow of a melt in the depth direction at a typical instant under the biaxial swinging.

FIG. 4A shows the flow velocity distribution in a vertical plane of the melt-holding vessel in the case of a biaxial swing operation, where the swing frequencies are fx=fy=0.017 (Hz) and the swing amplitudes are a=b=±4°.

Figure 4B:
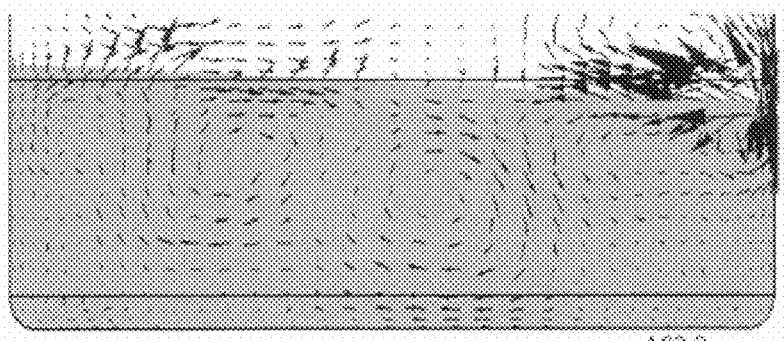
FIG. 4B is a diagram showing the calculated results of the magnitude and the direction of the flow of a melt in the depth direction at a typical instant under the uniaxial swinging.

FIG. 4B shows, for comparison, the flow velocity distribution in a vertical plane of the melt-holding vessel in the case of a uniaxial (X-axis) swing operation. Except for the uniaxial swing operation, the conditions are the same as in FIG. 4A.

In the biaxial swinging, as shown in FIG. 3A, the time variation of the flow velocity of the melt is small to realize a flow having a stationary magnitude. In the uniaxial swinging, as shown in FIG. 3B, the flow velocity largely changes with time, and the average of the flow velocity is approximately half the average of the flow velocity in the biaxial swinging. From FIGS. 3A and 3B, it is clear that according to the biaxial swinging, as compared to the uniaxial swinging, even the same swing frequency gives a larger average to the flow velocity of the melt.

Additionally, in the biaxial swinging, as shown in FIG. 4A, it is also possible to vertically form an always constant melt flow in the melt-holding vessel. This shows that the nitrogen dissolving through the gas-liquid interface can be transferred efficiently even to the bottom portion of the melt-holding vessel, and the biaxial swinging is effective in improving the growth rate even when a seed crystal is placed on the bottom of the melt-holding vessel. On the contrary, in the uniaxial swinging, as shown in FIG. 4B, the melt collides with the vessel wall, and the melt flow is remarkably varied in the vicinity of the wall. When the melt stirring is positively performed with such a swing mechanism, particularly because the melt during the crystal growth is in a supersaturated state, the generation of non-uniform nuclei caused by the collision of the melt with the vessel wall is likely to occur. Non-uniformity of a property such as the variation of the crystal thickness caused by a difference in melt flow between the central portion and the surrounding portion of the melt-holding vessel is also likely to occur.

FIGS. 5A, 5B, 6A and 6B show typical conditions of the in-X-Y-plane flow velocity distribution.

Figure 5A:
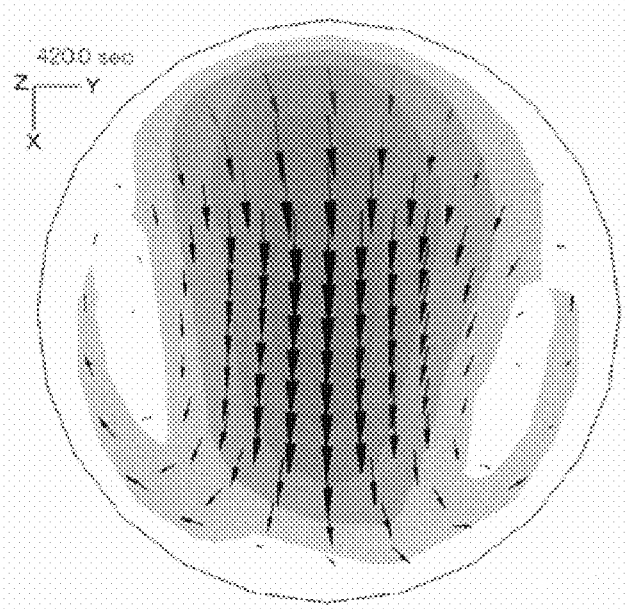
FIG. 5A is a diagram showing the calculated results of the magnitude and the direction of the flow of a melt in the horizontal direction at a typical instant under the biaxial swinging.
Figure 5B:
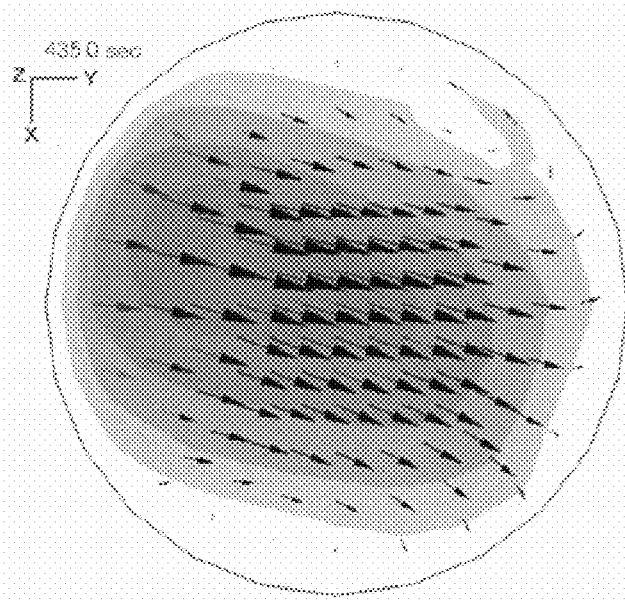
FIG. 5B is a diagram showing the calculated results of the magnitude and the direction of the flow of a melt in the horizontal direction at a typical instant under the biaxial swinging.

FIGS. 5A and 5B each show the melt flow in the case of the biaxial swinging (4 degrees, 0.017 Hz). The magnitude of the flow velocity is approximately constant, and only the flow direction is varied. It can be said that the biaxial swing operation is also effective in suppressing the in-plane variation of the crystal thickness.

Figure 6A:
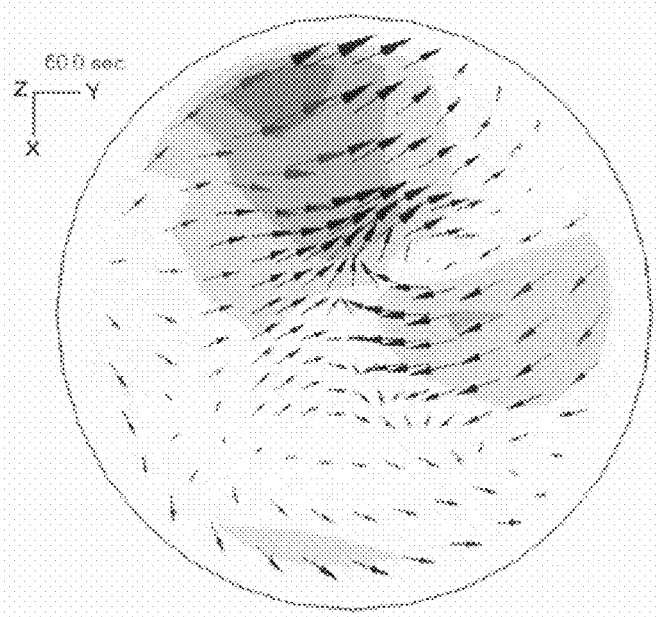
FIG. 6A is a diagram showing the calculated results of the magnitude and the direction of the flow of a melt in the horizontal direction at a typical instant under the uniaxial swinging.
Figure 6B:
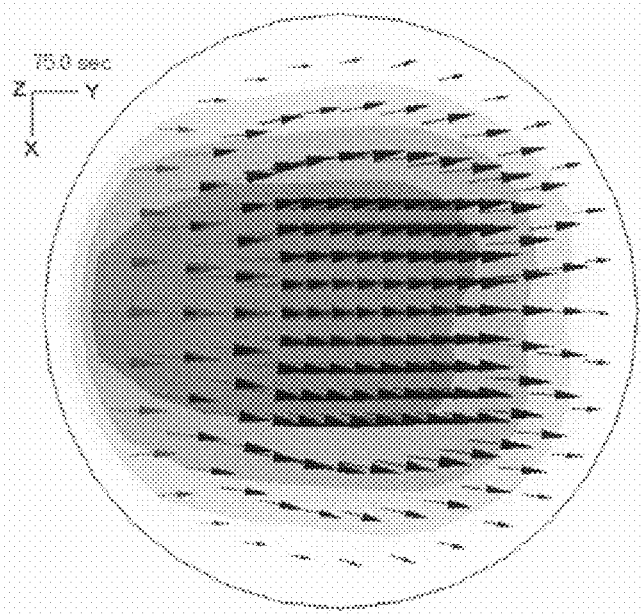
FIG. 6B is a diagram showing the calculated results of the magnitude and the direction of the flow of a melt in the horizontal direction at a typical instant under the uniaxial swinging.

FIGS. 6A and 6B each show the melt flow in the case of the uniaxial swinging (4 degrees, 0.017 Hz). At a certain instant the flow is disturbed and the melt flow is almost stopped at a particular position (at the in-plane central portion in the figure), and on the other hand, at an instant showing the fastest flow, a flow in one direction is generated, the flow direction is perpendicular particularly to the swing axis, and the flow velocity is small in the peripheral portion in the melt-holding vessel. Such a melt flow is disadvantageous also from the viewpoint of achieving the in-plane uniformity of the crystal thickness.

As is clear from the results shown in the above described FIGS. 3A, 3B, 4A, 4B, 5A, 5B, 6A and 6B, it is preferable to biaxially swing the melt-holding vessel for the purpose of stirring the melt at the time of performing the crystal growth.

Although the two axes serving as the centers for swinging may take any directions, the two axes are preferably horizontal or nearly horizontal and the angle between the two axes is preferably 90° or approximately 90°. Such a positional relation between the two axes permits the stirring of all the contents placed in the melt-holding vessel while the positional non-uniformity is being maintained at a minimum. Even when the two axes are each inclined by approximately ±20° from the horizontal axis, the same effects can be obtained. Additionally, even when the angle between the two axes is deviated from 90° to be approximately 90°±20°, the same stirring effect can be obtained.

On the other hand, a small frequency of the swing motion makes the melt stirring insufficient, and a too large swing frequency offers a cause for the occurrence of the non-uniformity. When the frequency of the swing motion about one axis (X-axis) is represented by fx and the frequency of the swing motion about the other axis (Y-axis) is represented by fy, these frequencies may take any values as long as fx=0.0033 to 1 (Hz) and fy=0.0033 to 1 (Hz); however, preferably 0.0083 (Hz)≤fx≤0.33 (Hz) and 0.0083 (Hz)≤fy≤0.33 (Hz); and more preferably 0.017 (Hz)≤fx≤0.1 (Hz) and 0.017 (Hz)≤fy≤0.1 (Hz).

The swing frequencies about the first and second axes at the preliminary growth stage in which the temperature is increased to a predetermined temperature for forming the melt are preferably larger than the swing frequencies about the first and second axes during the crystal growth. This is because stirring to quickly form a uniform melt is preferable in the preliminary growth stage, and on the other hand, moderate stirring is preferable during the crystal growth.

Although any relation between the swing frequencies fx and fy may be adopted, because more uniform stirring is possible in the melt-holding vessel, the relation fx=fy is preferably set, and further the phase difference ϕx−ϕy is preferably made constant where ϕx represents the phase term of the swing motion about one axis (X-axis) and φy represents the phase term of the swing motion about the other axis (Y-axis).

Because stirring can be made uniformly over the whole surface in the melt-holding vessel, the trajectory of the in-plane central portion of the melt-holding vessel is preferably a Lissajous figure or nearly a Lissajous figure, and the swing amplitude a about the X-axis and the swing amplitude b about the Y-axis are preferably equal to or nearly equal to each other. Here, the statement that the trajectory is nearly a Lissajous figure is intended to mean that when the X-axis and the Y-axis are displaced from each other, for example, by tens of centimeters in the height direction, the trajectory does not form a perfect Lissajous figure, but substantially the same stirring effect as based on the Lissajous figure can be achieved, and hence included is the case that can be substantially regarded as a Lissajous figure in the above-described sense. Additionally, the statement that the swing amplitude a and the swing amplitude b are nearly equal to each other means that even when from one amplitude (for example, a) the other amplitude (for example, b) is deviated by approximately ±20%, the same effect as with the swing amplitudes equal to each other can be obtained as the stirring effect, and hence the swing amplitudes are only required to be equal to each other with a margin of ±20%.

The swing waveform (driving waveform) about each of the two axes (X-axis and Y-axis) is preferably a sine wave or approximately a sine wave, or a triangle wave or approximately a triangle wave. This is because under these conditions no abrupt impact is exerted on the interior of the melt-holding vessel 160 when the direction of the swing motion is reversed, and hence it is made possible to reduce the generation of non-uniform nuclei. Here, the statement that the swing waveform is approximately a sine wave is intended to mean that the swing waveform is not exactly a sine wave but can be approximately regarded as a sine wave, depending on the driving method of the driving system, for example, when the swing motion is driven with a common rotary motor and a crank structure, and hence included is the case where the swing waveform substantially operates as a sine wave. Also with respect to the triangle wave, the statement that the swing waveform is approximately a triangle wave is intended to mean that included is the case where, for example, when a crank structure and various driving systems are interposed, the swing waveform is not exactly a triangle wave, but the swing waveform substantially operates as a triangle wave.

The flow of the melt in the vicinity of the seed crystal in the melt-holding vessel 160 is preferably such that the magnitude thereof is constant or nearly constant, and only the direction thereof is periodically varied. This is because a uniform flow can be formed over the whole surface in the melt-holding vessel 160, the whole melt can be stirred uniformly and the thickness distribution of the grown crystal can be made small. Here, the statement that the flow of the melt is nearly constant means that with a flow velocity falling approximately within a margin of ±30% from the average flow velocity, even when the flow velocity is varied, the same results of the crystal growth can be expected, and hence included is the case where the flow velocity falls within the range of the average±30%.

Second Embodiment

Figure 7:
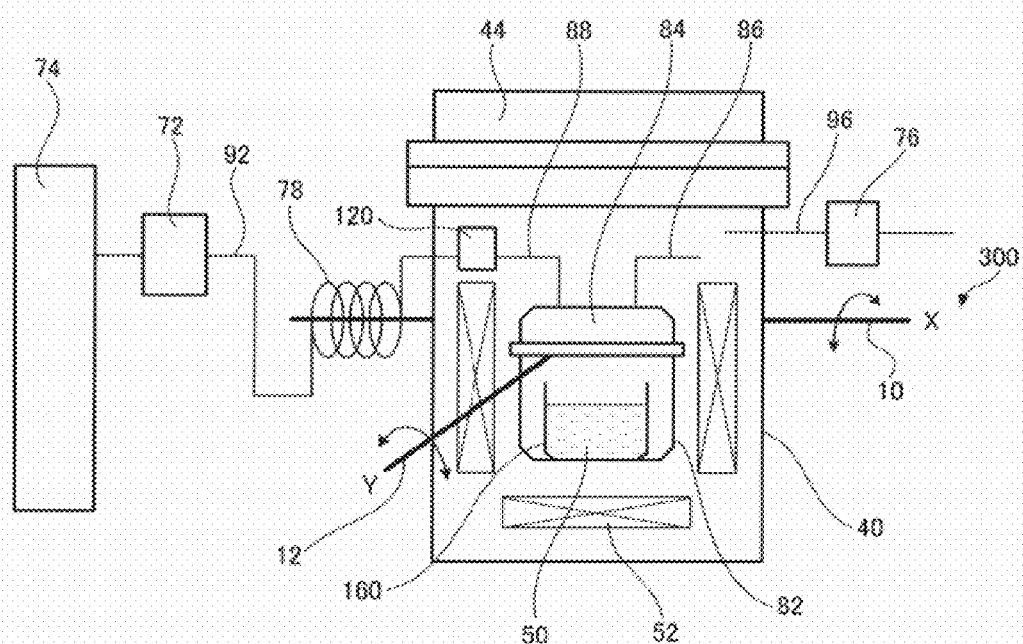
FIG. 7 is a schematic sectional view illustrating the configuration of an apparatus for growing a crystal of a second embodiment of the present invention.

FIG. 7 illustrates the configuration of an apparatus for growing a crystal of a second embodiment of the present invention.

In the apparatus for growing a crystal, a part of a flexible gas pipe 78 constituting a part of a gas pipe 92 between a gas feeder 74 and a pressure vessel 40 is disposed in a spiral shape so as to surround the periphery of an X-axis swing shaft 10 (or alternatively a Y-axis swing shaft 12). Additionally, an airtight reaction vessel 82 being equipped with a gas introduction pipe 88 and a gas discharge pipe 86 and housing a melt-holding vessel 160 is disposed in a freely detachable configuration with respect to the pressure vessel 40. Reference numerals 84 and 120 denote the lid of the reaction vessel and a gas pipe connector, respectively. Otherwise, the apparatus for growing a crystal is the same as in the first embodiment.

The use of the reaction vessel 82 is effective because when starting materials such as an alkali metal (or an alkali earth metal) and a group III element, and where needed, a dopant are, placed in the reaction vessel 82, the materials can be placed without being brought into contact with air. For example, in a glove box in which the air therein is replaced with nitrogen, the starting materials are placed in the melt-holding vessel 160, the melt-holding vessel 160 is hermetically sealed in the reaction vessel 82, the reaction vessel 82 is disposed, under the conditions that the gas introduction pipe 88 and the gas discharge pipe 86 are closed, in the pressure vessel 40 having a nitrogen-containing gas atmosphere, and a connection with the gas pipe connector 120 is performed while the nitrogen-containing gas is being made to flow; thus the contamination of the air can be eliminated.

Into the reaction vessel 82 disposed in the pressure vessel 40, the nitrogen-containing gas is directly fed from the gas feeder 74 as it is highly pure, wherein the nitrogen-containing gas passes through a gas flow rate regulator 72, the spiral-shaped flexible gas pipe 78 and the gas pipe connector 120. The unreacted gas that has not contributed to the crystal growth reaction in the reaction vessel 82 is discharged through the gas discharge pipe 86 into the pressure vessel 40, and further discharged to outside the pressure vessel 40 through a pressure regulator 76.

In the preliminary growth stage and the crystal growth stage in the melt-holding vessel 160, the pressure vessel 40 is biaxially swung in the same manner as in the first embodiment, and when the crystal growth time in this case is assumed to be 100 hours to 200 hours, the number of swing times reaches 1200 to 720000 (in the case of 0.0033 to 1 Hz). Consequently, the durability of the flexible gas pipe 78 is very important. Here, the spiral-shaped flexible gas pipe 78 formed of a fine pipe is disposed so as to surround the periphery of the X-axis swing shaft 10, and hence the flexibility is enhanced and the durability is largely enhanced, and even with the long-term swing operation, the deterioration of the flexible gas pipe 78 is substantially hardly caused, and it is almost not necessary to replace the flexible gas pipe 78.

Most of the flexible gas pipes for use in such an application are of a bellows type made of a metal or of a type in which the pipe interior is coated with an organic material such as Teflon (registered trade name), and such pipes are large in surface area and easily undergo gas adsorption, and hence are likely to be a contamination source of the high purity gas fed from the gas feeder 74. However, the spiral-shaped flexible gas pipe 78 used here is somewhat long in pipe length but small in gas adsorption area, and hence can more easily reduce the generation of impurity gases as compared to the bellows-type pipes or the like.

Therefore, according to the apparatus for growing a crystal of the second embodiment, in addition to the melt stirring effect based on the biaxial swinging, the effect of reducing the effects of the impurity gases from a heating unit 52 or the like on the basis of the use of the reaction vessel 82 and the effect of reducing the impurity gases from the flexible gas pipe 78 make it possible to feed a high-purity gas to the interior of the pressure vessel 40 (and the reaction vessel 82), and hence remarkably reduce the effects of the impurity gases on the contents of the melt-holding vessel 160. Consequently, the growth of a large-size crystal is made possible with dramatically reduced macro-defects and no variation of the crystal thickness.

Third Embodiment

Figure 8A:
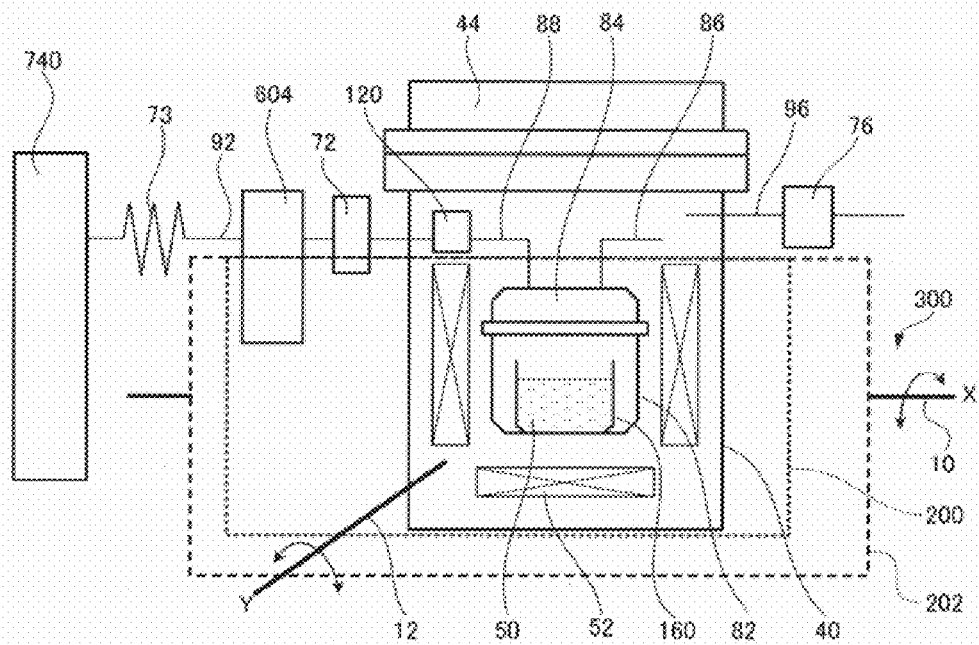
FIG. 8A is a schematic sectional view illustrating the configuration of an apparatus for growing a crystal of a third embodiment of the present invention.
Figure 8B:
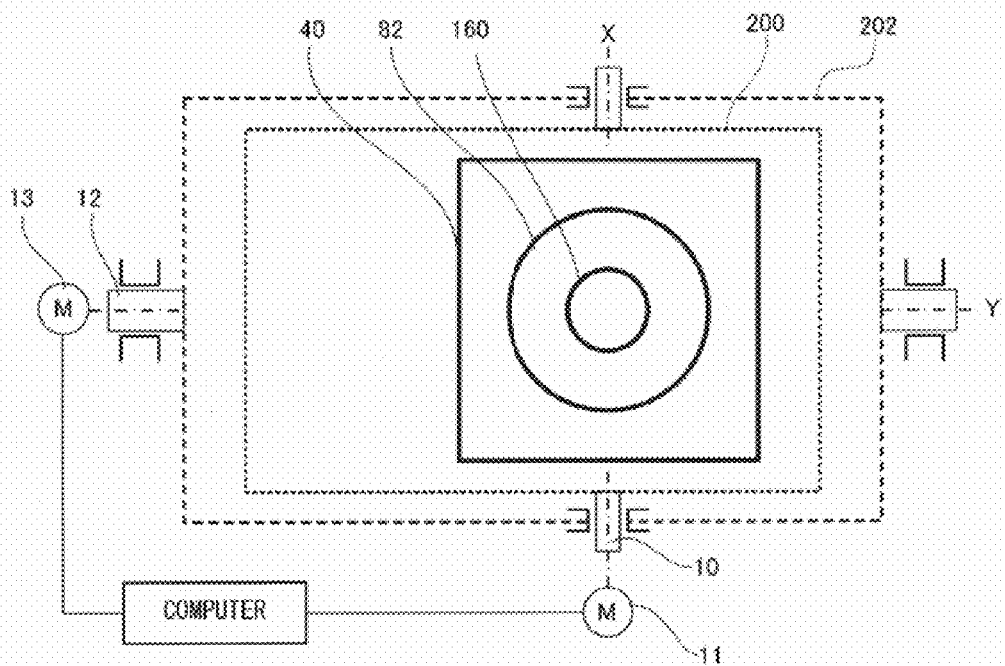
FIG. 8B is a schematic sectional view illustrating the configuration of the apparatus for growing a crystal of the third embodiment of the present invention.

FIGS. 8A and 8B illustrate the configuration of an apparatus for growing a crystal of a third embodiment of the present invention.

The apparatus for growing a crystal includes, as a swing unit 300, a support 200 on which a pressure vessel 40 is placed and an X-axis swing shaft 10 for swinging the support 200, a second support 202 supporting the X-axis swing shaft 10 and a Y-axis swing shaft 12 for swinging the support 202. Additionally, a gas booster (pump) 604 is disposed in an intervening manner in a gas pipe 92 between a low-pressure gas feeder 740 and the pressure vessel 40. The position of the gas booster 604 is closer to the pressure vessel 40 than the position of a flexible gas pipe 73 constituting a part of the gas pipe 92. Otherwise, the apparatus for growing a crystal is the same as in the second embodiment.

Here, it is to be noted that when an AlN crystal, for example, is grown as a group III nitride crystal, the pressure of the nitrogen-containing gas may be as low as 1 MPa or less (although the growth temperature is set, for example, at a temperature as high as 1000 to 1400° C.), and in contrast, when a GaN crystal is grown as a group III nitride crystal, the optimal pressure of the nitrogen-containing gas is, for example, 2 to 10 MPa.

In this apparatus for growing a crystal, the gas booster pump 604 is disposed, and hence, even when a GaN crystal associated with an optimal pressure of, for example, 2 to 10 MPa is grown, the low-pressure gas feeder 740 such as a gas feeder having a gas feeding capability of less than 1 MPa is permitted to be used. Consequently, as the flexible gas pipe 73, a flexible gas pipe for low pressure such as a bellows-type pipe is permitted to be used. While using the flexible gas pipe 73 for low pressure, the flexible gas pipe 73 is provided with durability and the need for frequent replacement thereof is eliminated. The use of the bellows-type gas pipe shown in the figure as the flexible gas pipe 73 for low pressure is more disadvantageous than the fine pipe type in the second embodiment with respect to the effects of the impurity gases, but more advantageous than a type in which an organic polymer is incorporated.

Accordingly, also with the apparatus for growing a crystal of the third embodiment, the melt stirring effect due to the biaxial swinging is achieved, and additionally, the high purity gas feeding is possible and the effects of the impurity gases on the contents of a melt-holding vessel 160 can be reduced. Consequently, the growth of a large-size crystal is made possible with dramatically reduced macro-defects and no variation of the crystal thickness.

Fourth Embodiment

Figure 9:
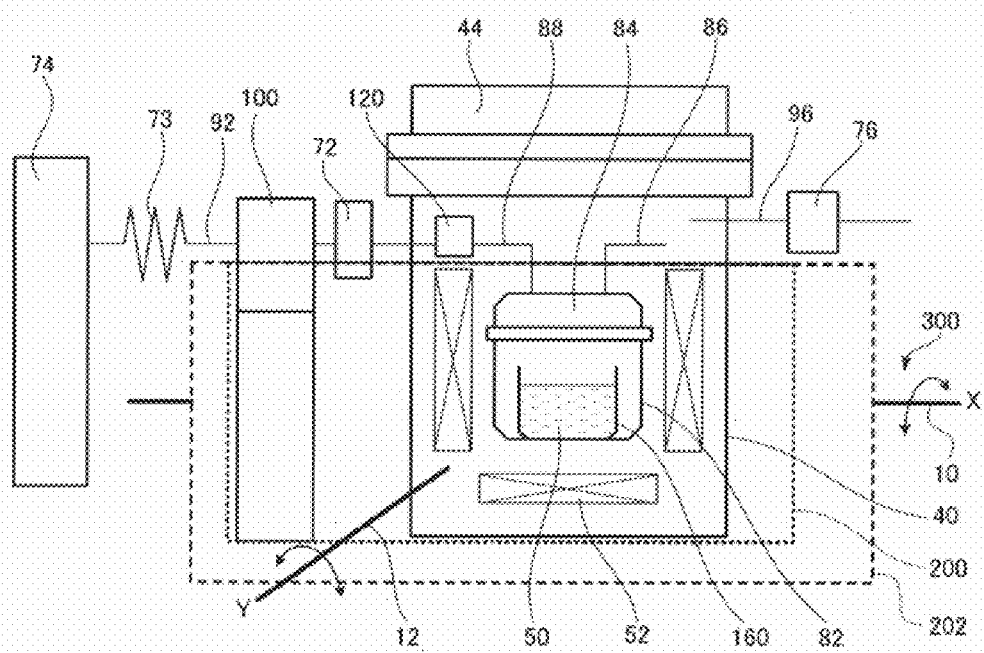
FIG. 9 is a schematic sectional view illustrating the configuration of an apparatus for growing a crystal of a fourth embodiment of the present invention.

FIG. 9 illustrates the configuration of an apparatus for growing a crystal of a fourth embodiment of the present invention.

The apparatus for growing a crystal includes, as a swing unit 300, a support 200 on which a pressure vessel 40 is placed and an X-axis swing shaft 10 for swinging the support 200, a second support 202 supporting the X-axis swing shaft 10 and a Y-axis swing shaft 12 for swinging the support 202. Additionally, for the purpose of more positively performing high purification of a gas, a gas high purification unit 100 is disposed in an intervening manner in a gas pipe 92 between a gas feeder 74 and the pressure vessel 40. The position of the gas high purification unit 100 is closer to the pressure vessel 40 than the position of a flexible gas pipe 73 constituting a part of the gas pipe 92. Otherwise, the apparatus for growing a crystal is the same as in the second embodiment.

Although as the gas high purification unit 100, those units which use various catalysts and filters may be adopted, a trap-type unit using liquid nitrogen may be preferably used. With such a trap-type unit, it is possible to effectively remove the moisture and the oxygen predominating in impurity gases from the flexible gas pipe 73, and hence the trap-type unit is effective in feeding of high purity gases to the pressure vessel 40; such a trap-type unit is very small in size so as to permit the unit itself to be disposed in the extreme vicinity of the pressure vessel 40, for example, in such a way that as shown in the figure, the unit concerned is placed on the support 200 in a manner swingable integrally with the pressure vessel 40.

Such disposition of the gas high purification unit 100 enables the improvement of the gas-purity degraded in the pipe path of the flexible gas pipe 73 or the like and enables feeding of a further higher purity gas from the gas feeder 74 into the pressure vessel 40 (the reaction vessel 82). Additionally, such placement of the gas high purification unit 100 in the swing mechanism enables the use of various types as the flexible gas pipe 73. Even the use of the bellows-type gas pipe as shown in the figure or a type incorporating an organic material enables the feeding of a high purity gas. Accordingly, the high flexibility and the high purity gas feeding are made compatible with each other.

Accordingly, also with the apparatus for growing a crystal of FIG. 9, the melt stirring effect due to the biaxial swinging is achieved, and additionally, a high purity nitrogen-containing gas made to pass through the gas high purification unit 100 can be fed into a reaction vessel 82 and the pressure vessel 40. Consequently, the growth of a crystal is made possible with dramatically reduced macro-defects (in particular, the inclusions of the unreacted group III element and the alkali metal or the alkali earth metal, in the interior of the crystal) and with no variation of the crystal thickness, and thus a large-size group III nitride crystal having excellent properties is obtainable.

Fifth Embodiment

Figure 10:
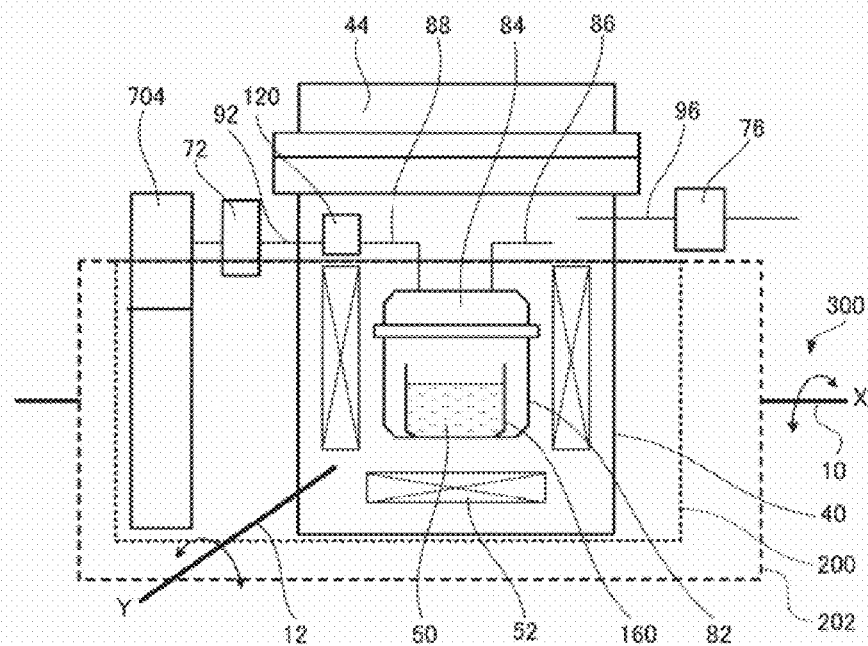
FIG. 10 is a schematic sectional view illustrating the configuration of an apparatus for growing a crystal of a fifth embodiment of the present invention.

FIG. 10 illustrates the configuration of an apparatus for growing a crystal of a fifth embodiment of the present invention.

The apparatus for growing a crystal includes, as a swing unit 300, a support 200 on which a pressure vessel 40 is placed and an X-axis swing shaft 10 for swinging the support 200, a second support 202 supporting the X-axis swing shaft 10 and a Y-axis swing shaft 12 for swinging the support 202. A gas feeder 704 is small in size, and is disposed in the vicinity of the pressure vessel 40 on the support 200 in a manner swingable integrally with the pressure vessel 40. Otherwise, the apparatus for growing a crystal is the same as in the second embodiment.

By disposing the small-size gas feeder 704 in the extreme vicinity of the pressure vessel 40, the pipe path of a gas pipe 92 is shortened so as to reduce the effect of gases emitted from the gas pipe 92, and by making the gas feeder 704 and the pressure vessel 40 swingable integrally with each other, the use of a flexible gas pipe is eliminated so as to further reduce the effect of the emitted gases. Thus, it is only required to enhance the gas purity of the gas feeder 704, and mechanisms for pressure boosting and high purification are not essential, and hence the size reduction of the whole gas feeding system is also feasible.

The gas feeder 704 may be a small-size gas cylinder, or alternatively a nitrogen gas feeder in which liquid nitrogen is vaporized. When the pressure cannot be boosted with a small-size gas cylinder to the intended pressure in the interior of the pressure vessel 40 (inclusive of the interior of the reaction vessel 82), a gas may be fed from a large-size gas cylinder (not shown) before the start of the swing operation to boost the pressure to the intended pressure, and then, for example, the gas system may be switched to the small-size cylinder.

Accordingly, also with the apparatus for growing a crystal of the fifth embodiment, the melt stirring effect due to the biaxial swinging is achieved, and additionally, a high purity nitrogen-containing gas can be fed into a reaction vessel 82 and the pressure vessel 40. Consequently, obtainable is a large-size group III nitride crystal having few macro-defects (in particular, the inclusions of the unreacted group III element and the alkali metal or the alkali earth metal, in the interior of the crystal), being free from the variation of the crystal thickness, and having excellent properties.

Sixth Embodiment

Figure 11:
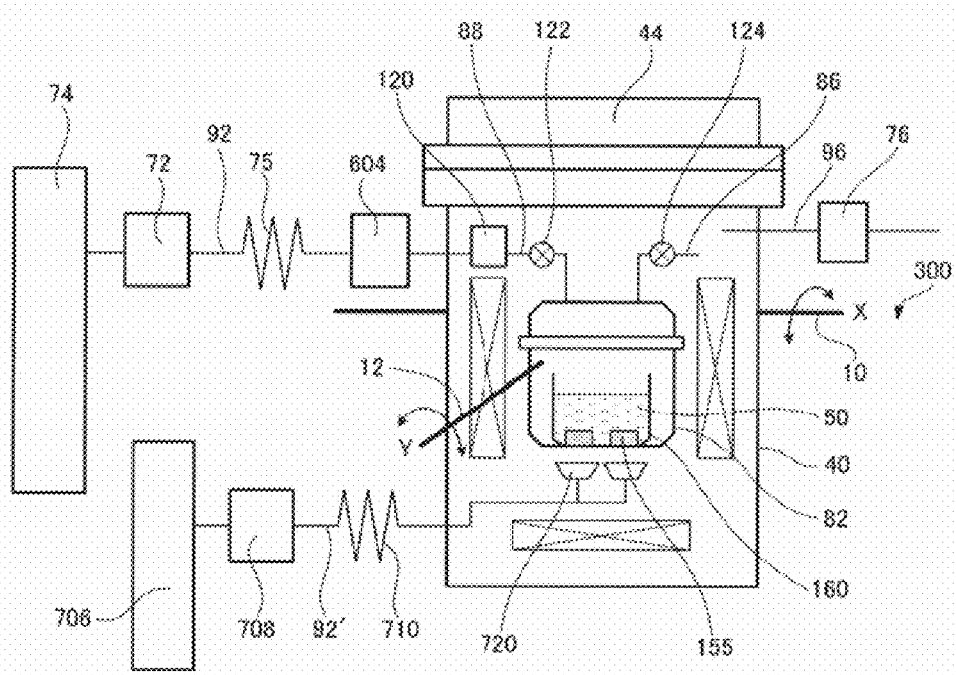
FIG. 11 is a schematic sectional view illustrating the configuration of an apparatus for growing a crystal of a sixth embodiment of the present invention.

FIG. 11 illustrates the configuration of an apparatus for growing a crystal of a sixth embodiment of the present invention.

In the apparatus for growing a crystal, a gas booster 604 is disposed in an intervening manner in a gas pipe 92 between a gas feeder 74 and a pressure vessel 40. The position of the gas booster 604 is closer to the pressure vessel 40 than the position of a flexible gas pipe 75 constituting a part of the gas pipe 92. A gas introduction pipe 88 and a gas discharge pipe 86 are equipped with valve units 122 and 124, respectively.

Additionally, separately from the gas pipe 92 for feeding a nitrogen-containing gas into a melt-holding vessel 160 (into a reaction vessel 82), the apparatus for growing a crystal has a second gas feeder 706 and a gas pipe 92 for feeding a nitrogen-containing gas to cool predetermined positions in the pressure vessel 40. A flow rate regulator 708 is disposed in an intervening manner in the gas pipe 92' between the second gas feeder 706 and the pressure vessel 40 and a part of the gas pipe 92' is a flexible gas pipe 710. The gas pipe 92' is made to diverge in such a way that gas release openings 720 are disposed so as to face the bottom of the melt-holding vessel 160 through the intermediary of the pressure vessel 40. Otherwise, the apparatus for growing a crystal is the same as in the second embodiment.

The use of the gas booster 604 in the above-described manner enables, as described in the third embodiment, the use of the flexible gas pipe 75 for low pressure, only slightly susceptible to the adsorbed gases and high in flexibility, and thereby enables the feeding of a high purity nitrogen-containing gas.

The nitrogen-containing as from the gas release openings 720 locally cools at least one or more in-plane direction positions of the melt-holding vessel 160 and enables efficient crystal growth at such positions.

Figure 12:
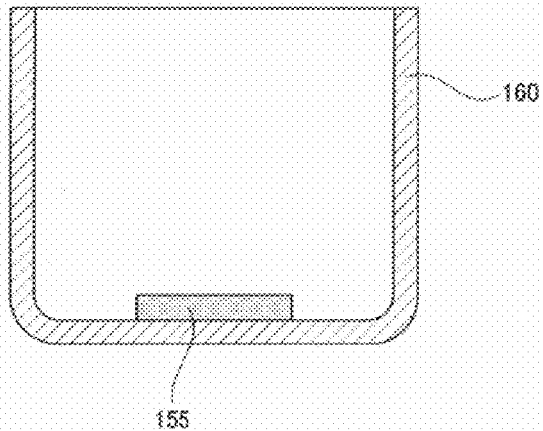
FIG. 12 is a view illustrating a crystal arrangement in a melt-holding vessel in the apparatus for growing a crystal of FIG. 11.
Figure 13A:
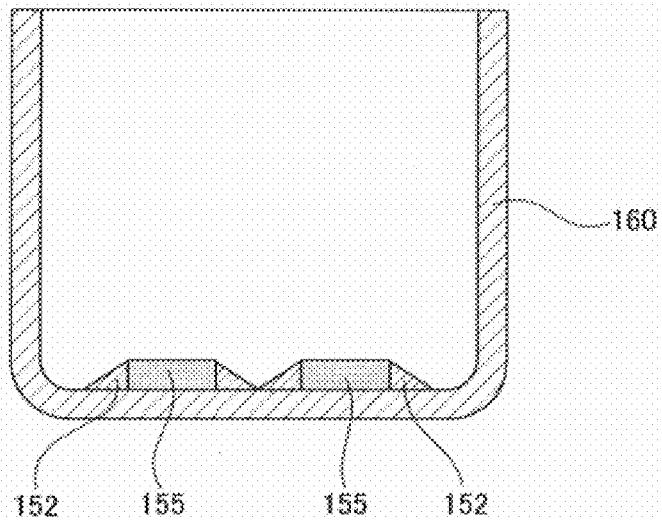
FIG. 13A is a view illustrating another crystal arrangement in the melt-holding vessel in the apparatus for growing a crystal of FIG. 11.
Figure 13B:
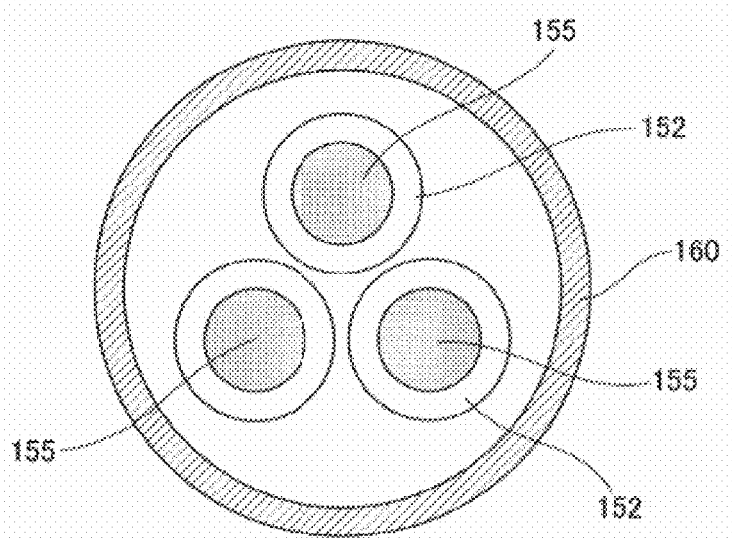
FIG. 13B is a view illustrating another crystal arrangement in the melt-holding vessel in the apparatus for growing a crystal of FIG. 11.

When seed crystals 155 are disposed as shown in the figure in the melt-holding vessel 160, the cooling positions are each set so as to nearly coincide with the central portion or the peripheral portion of each of the seed crystals 155. As shown in FIG. 12, only one seed crystal 155 may be disposed, and when the melt-holding vessel 160 is large in size, a plurality of seed crystals 155 may be disposed as shown in FIGS. 13A and 13B.

In any of the above-described cases, cooling of only the peripheral portion or the central portion of each seed crystal 155 enables the positive formation of the in-plane temperature distribution in the melt-holding vessel 160 and the use of the temperature difference enables the formation of the vertical convection of a melt 50. When as shown in FIGS. 13A and 13B, tapered spacers 152 are disposed on the periphery of the seed crystals 155, it is possible to suppress the disturbance of a liquid flow at the edges of the crystals, and hence it is possible to grow crystals higher in the thickness uniformity.

With respect to the whole melt-holding vessel 160, the surface portion of the melt is relatively high in temperature, and hence nitrogen is efficiently dissolved at the gas-liquid interface to reduce the supersaturation. Consequently, non-uniform nuclei are not generated therein. The bottom portion of the melt where the seed crystals 155 are disposed is relatively low in temperature, and hence the crystal growth can be performed efficiently. On the other hand, the temperature difference between the surface portion and the bottom portion of the melt results in the more positive formation of the vertical flow, and hence the nitrogen in the vicinity of the melt surface is efficiently transported to the bottom portion to enable the crystal growth rate to be improved.

Here, illustration with a figure is omitted, but when the reaction vessel 82 is large, a plurality of melt-holding vessels 160 may be disposed in the reaction vessel 82. In the present invention adopting the biaxial swinging, the convection of the melt in the melt-holding vessel 160 is determined almost only by the inclination angle of the vessel bottom, in other words, the effect of the centrifugal force is nearly negligible, and hence nearly the same melt stirring condition is feasible in the interior of each of the plurality of melt-holding vessels. Consequently, even when the plurality of melt-holding vessels 160 are disposed, the method of the present invention is very favorable for the purpose of stirring the melt, as compared to conventional methods such as a method in which the melt-holding vessel is rotated.

Accordingly, with this apparatus for growing a crystal, in addition to the melt stirring effect due to the biaxial swinging, the melt stirring can be performed more positively by feeding a high purity nitrogen-containing gas and also by taking advantage of the temperature distribution due to the cooling. Consequently, obtainable is a large-size group III nitride crystal having few macro-defects (in particular, the inclusions of the unreacted group III element and the alkali metal or the alkali earth metal, in the interior of the crystal) and having excellent properties. The disposition of a gas high purification unit on the upstream or downstream side of the gas booster 604 enables feeding of a further higher purity nitrogen-containing gas. Although the gas pipe 92' is extended from the second gas feeder 706, when the second gas feeder 706 and the gas feeder 74 are nearly the same in pressure, the gas pipe 92' may start from the gas feeder 74.

Further, the local cooling can be performed by making one gas pipe 92' diverge and finely adjusting the size of the nozzle of each of the gas release openings 720, and hence the local cooling can be performed far more easily as compared to a usual case where the temperature gradient in an electric furnace or the like is used, namely, a case where a large number of heaters are disposed or the number of turns of the heaters is varied. The local cooling based on the nitrogen-containing gas flow is also applicable for the purpose of compensating for the local temperature unevenness in a large heating apparatus.

Seventh Embodiment

With reference to FIG. 14, a seventh embodiment of the present invention is described. The apparatus configuration corresponds to a case where a pressure vessel 40 larger than conventional pressure vessels, a reaction vessel 82 larger than conventional reaction vessels and a plurality of melt-holding vessels 160 are set. For the purpose of disposing the plurality of melt-holding vessels 160 also vertically, partition plates 250 are disposed. The partition plates may have through-holes formed therein for the purpose of feeding nitrogen to the melt-holding vessels disposed in the lower positions. Otherwise the apparatus for growing a crystal is the same as in the first embodiment. Here, seed crystals 155 set in the melt-holding vessels 160 are preferably fixed in the melt-holding vessels 160 as shown in FIGS. 13A and 13B. Additionally, the X-axis and Y-axis may be allotted the same frequency such as approximately 0.016 Hz to 0.1 Hz, respectively, and may be allotted a swing amplitude of approximately 3 to 30°, respectively.

According to the present embodiment, the plurality of melt-holding vessels 160 are disposed in the reaction vessel 82, and hence a simultaneous growth of a large number of crystals is made possible. Additionally, the biaxial swinging about the X-axis and Y-axis is performed, and hence the growth of crystals having few macro-defects and being narrow in the film thickness distribution is made possible.

In the present embodiment, crystals are grown by setting the plurality of seed crystals in the plurality of melt-holding vessels 160, and hence a simultaneous growth of a large number of crystals is made possible. However, for example, due to a slight difference in the inclination of the melt-holding vessels and a slight difference in the in-plane temperature distribution in the furnace, variation among the individual crystals, with respect to the properties thereof, is likely to occur. For the purpose of eliminating this variation, it is effective to make the frequency about the X-axis and the frequency about the Y-axis deviate from each other, instead of making these frequencies completely coincide with each other. The deviation between the frequencies about the X-axis and the Y-axis makes the melt flow asymmetric and at the same time makes the melt flow slightly fluctuate, and hence enables suppression of the property variation among the crystals. On the other hand, when the swing frequencies about the X-axis and the Y-axis are close to each other, a highly symmetric stationary flow is formed, and hence the crystals are likely to be susceptible to asymmetry in the way of disposing the melt-holding vessels and slight in-plane asymmetry of the temperature distribution in the apparatus. However, by making the frequencies about the X-axis and the Y-axis slightly different from each other, the crystals are rendered to be hardly susceptible to the effects of these asymmetries.

With respect to the deviation between the frequencies about the X-axis and the Y-axis, the ratio of the frequency about the Y-axis to the frequency about the X-axis may be set approximately at 1.1× to 3×. Although here a description is given of the case where the frequencies are different, it is also possible to reduce the property variations among the individual crystals, for example, by making the amplitudes about the X-axis and the Y-axis slightly different from each other or by the intermittent or reversal operation of swing rotations about the X-axis and the Y-axis, with reference to a large number of asymmetries.

Hereinafter, Examples of the present invention are described in detail.

EXAMPLES

Hereinafter, the present invention is described in more detail with reference to specific Examples.

As an apparatus for growing a crystal, the above-described apparatus shown in FIG. 7 was used. The reference numerals allotted to the individual members are omitted. As starting materials, 60 g of Ga as a group III element, 66 g of Na as a flux component and a high purity nitrogen gas as a nitrogen-containing gas were used. This apparatus for growing a crystal is also applicable to the cases where the other group III elements, the other alkali metals and alkali earth metals are used.

The placement of the starting materials was performed in a glove box in which the air therein was replaced with nitrogen (Ar or He may also be used). First, in a melt-holding vessel 160, a GaN crystal grown on sapphire in a thickness of 10 to 20 µm (a GaN self-supporting substrate grown by vapor phase growth, or a GaN crystal grown by LPE may also be used) was disposed as a seed crystal on the vessel bottom in a horizontal position (the position may also be parallel, normal or slanting), and then the intended amounts of Ga and Na were set. Where carrier concentration control is necessary, an n-type dopant such as Ge or Si or a p-type dopant such as Mg or Zn may, of course, be added.

The melt-holding vessel was also set in a reaction vessel, in the glove box, then the lid of the reaction vessel was closed, and the ends of a gas introduction pipe and a gas discharge pipe were once perfectly closed with a wrapping film or the like. Then, the reaction vessel was set in a pressure vessel, and connected to a gas pipe extending from a gas feeder. For the purpose of preventing the air inflow at the time of this connection, this operation was performed while nitrogen gas was being made to flow from the gas feeder. For that purpose, it is convenient for the reaction vessel to be equipped with a valve as the reaction vessel shown in FIG. 11.

After the completion of setting of the reaction vessel, the lid of the pressure vessel was closed and the interior of the pressure vessel was vacuum evacuated. Also, at this time, the air inflow into the reaction vessel was prevented by performing the vacuum evacuation while the nitrogen gas from the gas feeder was being made to flow little by little. At the final stage of the vacuum evacuation, the introduction of the nitrogen gas was once halted, and the interior of the pressure vessel was evacuated to a high vacuum.

After the completion of the evacuation, a high purity nitrogen gas was again fed from the gas feeder to pressurize the interior of the pressure vessel to the intended pressure (the pressure in the reaction vessel reached approximately the same pressure). The intended pressure is appropriately approximately 2 MPa to 10 MPa, and here, was set at 3.5 to 5 MPa.

Additionally, the interior of the pressure vessel (accordingly also the interior of the reaction vessel) was increased in temperature to a predetermined crystal growth temperature. The crystal growth temperature is appropriately 700° C. to 1000° C. and here, was set at 850 to 900° C. The growth time was set at 150 to 200 hours.

In this case, a biaxial (X- and Y-axes) swing operation was performed while the temperature was being increased, and thus the melting of the starting materials and the crystal growth from the thus obtained melt were performed. As the swing condition, the swing frequency of 0.033 Hz to 1 Hz is applicable; however, here the swing frequency was varied between 0.008 Hz to 0.2 Hz. Additionally, the phase difference $\phi x - \phi y$ between about the X-axis direction and about the Y-axis direction was set such that $\phi x - \phi y = 90°$.

Table 1 shows the results for Examples 1 to 6 of the crystal growth under the biaxial swing operation and the results for Comparative Example 1 of the crystal growth performed in the same manner as in Examples 1 to 6 except that absolutely no swinging was conducted. Table 2 shows the results of Comparative Examples 2 to 6 of the crystal growth performed by conducting a uniaxial swing operation or by conducting absolutely no swing operation.

TABLE 1

Biaxial swinging

| | Frequency (X-axis, Y-axis) Hz | Macro-defects | Film thickness distribution |
|---|---|---|---|
| Example 1 | 0.008, 0.008 | G | G |
| Example 2 | 0.016, 0.016 | G | E |
| Example 3 | 0.016, 0.032 | E | E |
| Example 4 | 0.016, 0.050 | E | E |
| Example 5 | 0.100, 0.100 | E | E |
| Example 6 | 0.200, 0.200 | G | E |
| Comparative Example 1 | 0.000, 0.000 | A | P |

TABLE 2

Uniaxial swinging

| | Frequency Hz | Macro-defects | Film thickness distribution |
|---|---|---|---|
| Comparative Example 2 | 0.000 | A | P |
| Comparative Example 3 | 0.016 | A | A |
| Comparative Example 4 | 0.032 | G | G |
| Comparative Example 5 | 0.100 | Nonuniform nuclei were generated. | |
| Comparative Example 6 | 0.200 | Nonuniform nuclei were generated. | |

In the macro-defects shown in Tables 1 and 2, A (Average) indicates the level at which inclusions can be observed by visual inspection, G (Good) indicates the level at which inclusions almost cannot be observed even with an optical microscope under a magnification of 100×, and E (Excellent) indicates the level at which absolutely no inclusion can be observed except for the 3-mm peripheral section of the crystal. Additionally, in the film thickness (crystal thickness) distribution shown in Tables 1 and 2, A (Average), G (Good) and E (Excellent) indicate the film thickness distribution of ±50%, ±25% and ±10%, respectively, in relation to the average in the crystal plane (exclusive of the 3-mm peripheral section).

As is clear from Table 1, when the biaxial swinging was performed, the effect of improvement of the film thickness uniformity and the effect of reduction of the macro-defects (mainly inclusions) were observed, as compared to the case where absolutely no swinging was conducted.

Figure 15A:
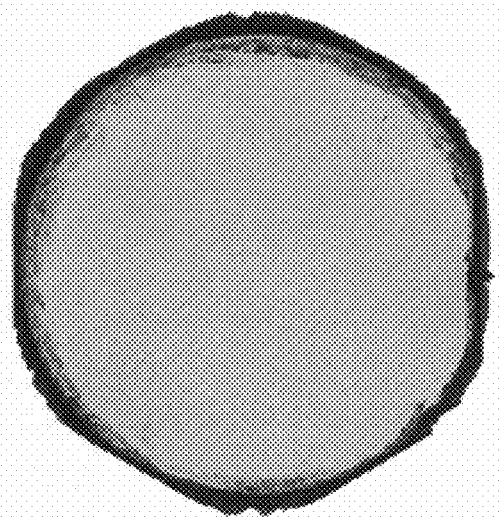
FIG. 15A is a view showing the appearance of the macrodefects of a crystal obtained by the present invention.
Figure 15B:
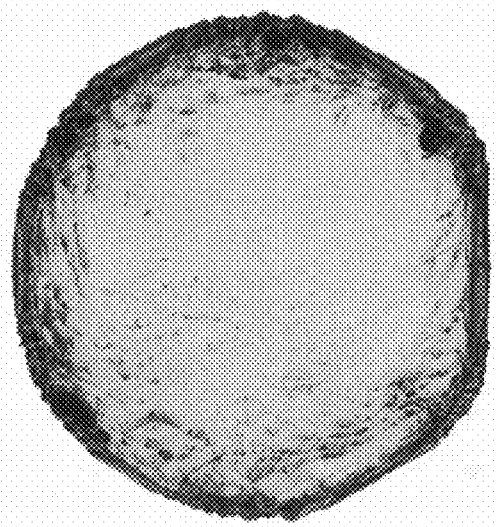
FIG. 15B is a view showing the appearance of the macrodefects of a crystal obtained by a conventional technique.

FIGS. 15A and 15B show pictures obtained by the observations with respect to the macro-defects of the crystals obtained by the present invention and a conventional technique, respectively. As shown in FIG. 15B, only with the conventional uniaxial swinging, the inclusions were distributed asymmetrically in the circumferential direction as a result of reflecting the asymmetry of the melt flow. On the contrary, as shown in FIG. 15A, the adoption of the biaxial swinging of the present invention gave the result that macro-defects were not observed in the area exclusive of the peripheral portion.

For the obtained crystals, etch pits and X-ray rocking curves were evaluated, and consequently, the cases where the biaxial swinging was performed exhibited the following satisfactory results.

(1) Etch pit density: $5 \times 10^5$ to $1 \times 10^4$ $(cm^{-2})$
(2) Half-width of X-ray rocking curve:
  Case of (0002): 20 to 80 seconds
  Case of (10-12): 20 to 58 seconds It is to be noted that although not described in the table, when the biaxial swinging was performed, the growth rate was improved by a factor of 1.5 to 2 as compared to the case where absolutely no swing operation was conducted.

As shown in Table 2, when the uniaxial swing operation was performed, the reduction of the macro-defects and the reduction of the film thickness unevenness were observed as compared to the case where absolutely no uniaxial swing operation was conducted, but the generation of nonuniform nuclei was observed with a swing frequency of 0.1 Hz or more. The occurrence of generation of nonuniform nuclei results in the increase of the macro-defects (natural nuclei are generated on the seed crystals, and such nuclei become macro-defects) and results in the decrease of the crystal growth rate, and also in this case, the film thickness was decreased to half to ⅓ the usually expected thickness. This coincides with the simulation result, described in the first embodiment, that the swinging involving only one axis causes the collision of the melt with the vessel wall and hence the generation of nonuniform nuclei is likely to occur.

Example 7

The above-described apparatus for growing a crystal shown in FIG. 8 was used as an apparatus for growing a crystal, 0.002 to 6 g of Ge was added as the n-type dopant component, and the 1-mm thick GaN crystal prepared by the LPE growth in Example 1 (the seed crystal may also be a GaN crystal or the like grown by the vapor phase growth) was subjected to crystal surface polishing and then used as the seed crystal, and thus the crystal growth was performed. The growth pressure was set at 4 MPa, the growth temperature was set at 880° C. and the growth time was set at 200 hours. The swing conditions were such that the swing frequencies about both of the X-axis direction and the Y-axis direction were set at 0.05 Hz and the phase difference between about the X-axis direction and about the Y-axis direction was set such that φx−φy=90°.

After the elapse of the growth time, a 4-mm thick (exclusive of the thickness of the seed crystal) 2-inch crystal was obtained on the seed crystal. From this grown crystal, six pieces of 500-μm thick crystals could be cut out with a wire saw (other cutter may also be used). Each of the cut-out crystals was subjected to treatments such as initial polishing, finish polishing, etching and cleaning to yield a 350-μm thick (about 2 inches) substrate.

These six pieces of substrates were examined by using a microscope with transmitted light, and consequently in the crystals of four pieces of substrates, inclusions of unreacted Ga, Na and the like were not found. Additionally, the dislocation densities of the same six pieces of substrates were evaluated by etching to be $5 \times 10^5$ to $1 \times 10^4$ $(cm^{-2})$, indicating that these substrates were extremely low in dislocation. Additionally, the half-width of the X-ray rocking curve exhibited the following satisfactory results.

Half-width of X-ray rocking curve:
  Case of (0002): 20 to 80 seconds
  Case of (10-12): 20 to 60 seconds Further, on the substrates free from inclusions, InGaN MQW blue LEDs having an emission wavelength of 460 nm were prepared, and the reliabilities of these LEDs were evaluated, and were consequently found to be almost free from light deterioration for 40000 hours or more in terms of room temperature; thus high-reliability LED elements could be realized.

From the results of Example 7, the following can be stated. The optimization of stirring on the basis of the swing conditions makes it possible to obtain a crystal almost free from macro-defects such as inclusions over the whole crystal. The carrier density of the crystal is controllable, depending on the addition amount of Ge, to the extent of approximately $2 \times 10^{16}$ to $2 \times 10^{19}$ (cm$^{-3}$). This is because the use of the apparatus for growing a crystal shown in FIGS. 8A and 8B enables the reduction of the oxygen and moisture values in the crystal growth atmosphere owing to a high purification unit of the apparatus, hence the amount of dopants incorporated into the crystal due to autodoping is reduced. Thus, this method is effective for the purpose of obtaining an appropriate n-type crystal on the basis of the Ge doping.

It is to be noted that although, in the present embodiment, only the stationary conditions are described as the biaxial swing operation, it is also possible, where necessary, to incorporate an intermittent or reversal operation. When a further reduction of the film thickness distribution is required, the liquid flow direction can be reversed to the opposite direction, and accordingly such operations are effective particularly for the reduction of the film thickness distribution as well as for the reduction of macro-defects.

Further, by changing the frequencies about the X-axis and Y-axis at a midway point during the crystal growth, or by making the frequencies about these two axes slightly deviate from each other, effective effects on the reduction of the film thickness distribution are similarly obtained.

INDUSTRIAL APPLICABILITY

The method for growing a crystal and the apparatus for growing a crystal of the present invention are made capable of producing a group III nitride crystal having few crystal defects (macro-defects) and being uniform in thickness particularly by adopting the biaxial swing for the melt stirring, and are useful for the production of high output power semiconductor lasers and high brightness LEDs, and further for the production of high reliability electronic devices.

The invention claimed is:

1. A method for growing a group III nitride crystal, the method comprising:
   growing a group III nitride crystal in a pressurized atmosphere of a nitrogen-containing gas from a melt comprising at least a group III element, nitrogen and an alkali metal or an alkali earth metal; and
   swinging a melt-holding vessel about two axes simultaneously, the melt-holding vessel holding, the melt,
   wherein the two axes are different in direction from each other, and
   wherein an angle between the two axes is 90° or approximately 90°.

2. The method for growing a group III nitride crystal according to claim 1, wherein the melt-holding vessel is swung through an intermediary of a pressure vessel in which the melt-holding vessel is disposed.

3. The method for growing a group III nitride crystal according to claim 2, further comprising:
   feeding the nitrogen-containing gas at least one of (a) from a gas feeder disposed in a vicinity of the pressure vessel, and (b) from the gas feeder through an impurity remover disposed in a vicinity of the pressure vessel.

4. The method for growing a group III nitride crystal according to claim 1, wherein the two axes are each a horizontal axis or a nearly horizontal axis.

5. The method for growing a group III nitride crystal according to claim 1, wherein when a frequency of a swing motion about a first axis of the two axes is represented by fx and a frequency of a swing motion about a second axis of the two axes is represented by fy, relations $0.0033 \leq fx \leq 1$ (Hz) and $0.0033 \leq fy \leq 1$ (Hz) hold.

6. The method for growing a group III nitride crystal according to claim 5, wherein swing frequencies about the first and second axes in a preliminary growth stage in which a temperature is increased to a predetermined temperature at which the melt is prepared are larger than swing frequencies about the first and second axes during crystal growth.

7. The method for growing a group III nitride crystal according to claim 5, wherein a relation fx=fy holds.

8. The method for growing a group III nitride crystal according to claim 1, wherein when a phase term of a swing motion about a first axis of the two axes is represented by $\Phi x$ and a phase term of a swing motion about a second axis of the two axes is represented by $\Phi y$, a phase difference $\Phi x - \Phi y$ is constant.

9. The method for growing a group III nitride crystal according to claim 8, wherein a trajectory of an in-plane center of the melt-holding vessel is a Lissajous figure or approximately a Lissajous figure.

10. The method for growing a group III nitride crystal according to claim 1, wherein a swing amplitude a about a first axis of the two axes and a swing amplitude b about a second axis of the two axes are equal to or approximately equal to each other.

11. The method for growing a group III nitride crystal according to claim 1, wherein a swing waveform about each of the two axes is a sine wave or approximately a sine wave, or a triangle wave or approximately a triangle wave.

12. The method for growing a group III nitride crystal according to claim 1, wherein a flow of the melt in a vicinity of a seed crystal in the melt-holding vessel is constant or approximately constant in magnitude and undergoes a periodic variation only with respect to a direction of the flow.

13. A method for growing a group III nitride crystal the method comprising:
   growing a group III nitride crystal in a pressurized atmosphere of a nitrogen-containing as from a melt comprising at least a group III element, nitrogen and an alkali metal or an alkali earth metal; and
   swinging a melt-holding vessel about two axes simultaneously, the melt-holding vessel holding the melt,
   wherein the two axes are different in direction from each other, and
   wherein at least one in-plane direction position of the melt-holding vessel is locally cooled.

14. The method for growing a group III nitride crystal according to claim 13, wherein a position in the melt-holding vessel, corresponding to a central portion or a peripheral portion of a seed crystal is cooled.

15. The method for growing a group III nitride crystal according to claim 1, wherein cooling is performed with a flow of the nitrogen-containing gas.

* * * * *